United States Patent [19]

Ratner

[11] Patent Number: 5,726,587
[45] Date of Patent: Mar. 10, 1998

[54] BICMOS TRI-STATE BUFFER WITH LOW LEAKAGE CURRENT

[75] Inventor: Steven J. Ratner, Santa Clara, Calif.

[73] Assignee: Hewlett-Packard Company, Palo Alto, Calif.

[21] Appl. No.: 711,315

[22] Filed: Sep. 3, 1996

Related U.S. Application Data

[63] Continuation of Ser. No. 512,959, Aug. 9, 1995, abandoned, which is a continuation of Ser. No. 259,753, Jun. 10, 1994, abandoned.

[51] Int. Cl.$^6$ .................................................. H03K 19/01
[52] U.S. Cl. ................................ 326/56; 326/18; 326/84
[58] Field of Search .................................. 326/17, 18, 30, 326/56, 58, 84, 110; 327/324, 325, 327, 328

[56] References Cited

U.S. PATENT DOCUMENTS

| | | | |
|---|---|---|---|
| 4,490,631 | 12/1984 | Kung | 307/456 |
| 4,701,642 | 10/1987 | Pricer | 326/110 |
| 5,047,669 | 9/1991 | Iwamura et al. | 307/446 |
| 5,107,142 | 4/1992 | Bhamidipaty | 307/446 |
| 5,107,143 | 4/1992 | Ueno et al. | 326/84 |
| 5,153,464 | 10/1992 | Joly | 307/473 |
| 5,426,377 | 6/1995 | Kimura | 326/110 |

*Primary Examiner*—Edward P. Westin
*Assistant Examiner*—Benjamin D. Driscoll
*Attorney, Agent, or Firm*—Pamela Lau Kee

[57] ABSTRACT

An improved tri-state output buffer having an emitter-follower output stage clamps the reverse-bias voltage across the base-emitter path of an emitter-follower to limit the output leakage current and thereby extending the operating life of an integrated circuit (IC). A current sensitive voltage device such as a bipolar transistor or diode clamps the reverse-bias voltage of the base-emitter path. Voltage clamping prevents the bipolar transistors from activating while the buffer is disabled. The output leakage current that occurs when the junction is forward biased is minimized. This results in low output load capacitance that improves the propagation delay particularly when multiple buffers are used.

9 Claims, 8 Drawing Sheets

FIG. 1

| IN | EN | CC | OUT |
|----|----|----|-----|
| 0  | 1  | 0  | 0   |
| 1  | 1  | 0  | 1   |
| X  | 0  | 1  | Z   |

BICMOS TRI-STATE BUFFER WITH LOW LEAKAGE CURRENT

CROSS REFERENCE TO RELATED APPLICATION(S)

This is a continuation of application Ser. No. 08/512,959 filed on Aug. 9, 1995, now abandoned, which is a continuation of application Ser. No. 08/359,753 filed on Jun. 10, 1994, now abandoned.

FIELD OF THE INVENTION

The present invention relates to a tri-state output buffer having an emitter-follower output stage. More particularly, this invention pertains to a tri-state buffer which clips the reverse-bias voltage across the base-emitter path of the emitter-follower output stage to thereby limit the output leakage current and reduce the output capacitance.

BACKGROUND OF THE INVENTION

A inverting tri-state buffer comprising bipolar and CMOS devices (BiCMOS) has an output node that has one of three logic states: "low", "high", and "high-impedance". An enabling signal, in combination with an input signal, determines the state of the output node. Generally, the emitter-follower output stage consists of two transistors. One of these transistors is connected as a non-inverting amplifier; a signal received at the base of this transistor appears in non-inverted form at its emitter. The other transistor is connected as an inverting amplifier; a signal received at the base of this transistor appears in inverted form at its collector. This type of inverting amplifier is often referred to as a "common-emitter" amplifier. The emitter of the non-inverting amplifier and the collector of the common-emitter amplifier are connected together to define the output node of the emitter-follower output stage. Such a circuit configuration is sometimes described as a totem-pole configuration. When the enabling signal is enabled and input signal has a "low" state, the output node has a "high" state as the non-inverting amplifier is "on" and the common-emitter amplifier is "off". A "low" state is achieved on the output node when the enabling signal is enabled and the input signal has a "high" state as the non-inverting amplifier is "off" and the common-emitter amplifier is "on". If the enabling signal has "high-impedance" (disabled), both the non-inverting amplifier and the common-emitter amplifier are "off". Under these conditions, the output node and therefore the inverting tri-state buffer is "high-impedance".

When the inverting tri-state buffer has "high-impedance", parasitic leakage currents and capacitances, which are inherent to integrated circuits, become critical. When the buffer has "high-impedance", a substantial reverse bias voltage ($V_{BE}$<0) is applied across the base-emitter junction of the non-inverting amplifier. A reverse-bias voltage can slowly degrade and effect the long-term reliability of an IC. Furthermore, forward biasing across this junction can induce unintended current flow within the disabled buffer, hampering its effective operation. The rate of degradation can be lowered by reducing the voltage supplied to the buffer which thereby reduces the reverse bias voltage. Although the voltage requirements have diminished and will diminish further for CMOS based devices, the discrete world that supplies power to the IC still uses 5 volt supplies. In operation, the circuits are operated at the maximum supply voltages to provide maximum drive to other devices.

In U.S. Pat. No. 5,153,464, Joly introduced a CMOS transmission gate across each base-emitter junction in the output stage to control the reverse-biasing by selectively adjusting the resistance across the emitter-base junctions to reduce the reverse bias voltage and the high-impedance path is maintained when the inverting tri-state buffer is disabled. Unfortunately, the output capacitance of the internal transmission gates is significant and places a heavy load on the output node, particularly when the buffers are connected. This heavy load negates the performance gains in drive that are expected when designing in a BiCMOS based process.

What is desirable is an improved inverting tri-state buffer comprising bipolar and CMOS devices that can support maximum supply voltages under forward or reverse bias conditions during the high-impedance state to extend the operating life of an integrated circuit. It would be beneficial if the inverting tri-state buffer had a low output capacitance for improved performance.

SUMMARY OF THE INVENTION

An improved tri-state buffer designed in a BiCMOS based process supports maximum supply voltages during the high impedance state by clipping the reverse-bias voltage across a base-emitter path of an emitter-follower output stage. This base-emitter path is defined as existing between the base of the non-inverting amplifier and the emitter of the common-emitter amplifier. Clipping the reverse-bias voltage reduces the output leakage current and thereby extends the operating life of an integrated circuit (IC) by preventing the bipolar transistors in the output stage from activating while the buffer is disabled. A current sensitive voltage device, such as a diode in series with a FET, is connected between the base of the non-inverting amplifier and the emitter of the common-emitter amplifier. An NPN transistor maybe connected as a PN device and used as a diode part of the current-sensitive voltage device. The dimensions are selected so as to minimize any output leakage current that may occur if the base of the non-inverting amplifier becomes positive with respect to the emitter of the common-emitter amplifier. The base of the non-inverting amplifier can become positive with respect to the emitter of the common-emitter amplifier any time the tristate buffer is in its high impedance state and an external circuit connected to the output node foes to a low voltage. Use of the current sensitive device in this fashion results in low output load capacitance that improves the propagation delay particularly when multiple buffers are used.

DETAILED DESCRIPTION OF THE PREFERRED EMBODIMENTS

An improved tri-state buffer, designed in a BiCMOS based process, supports maximum supply voltages during the high impedance state by clipping the reverse-bias voltage between a base of a non-inverting amplifier and an emitter of a common-emitter amplifier in an emitter follower output stage to reduce the output leakage current and thereby extends the operating life of an integrated circuit (IC). Clipping the reverse-bias voltage prevents the bipolar transistors in the output stage from activating while the buffer is disabled. When the output stage is activated, the output leakage current that occurs when the base-emitter path is forward biased is minimized. This results in low output load capacitance that improves the propagation delay particularly when multiple buffers are used.

Figure 1:
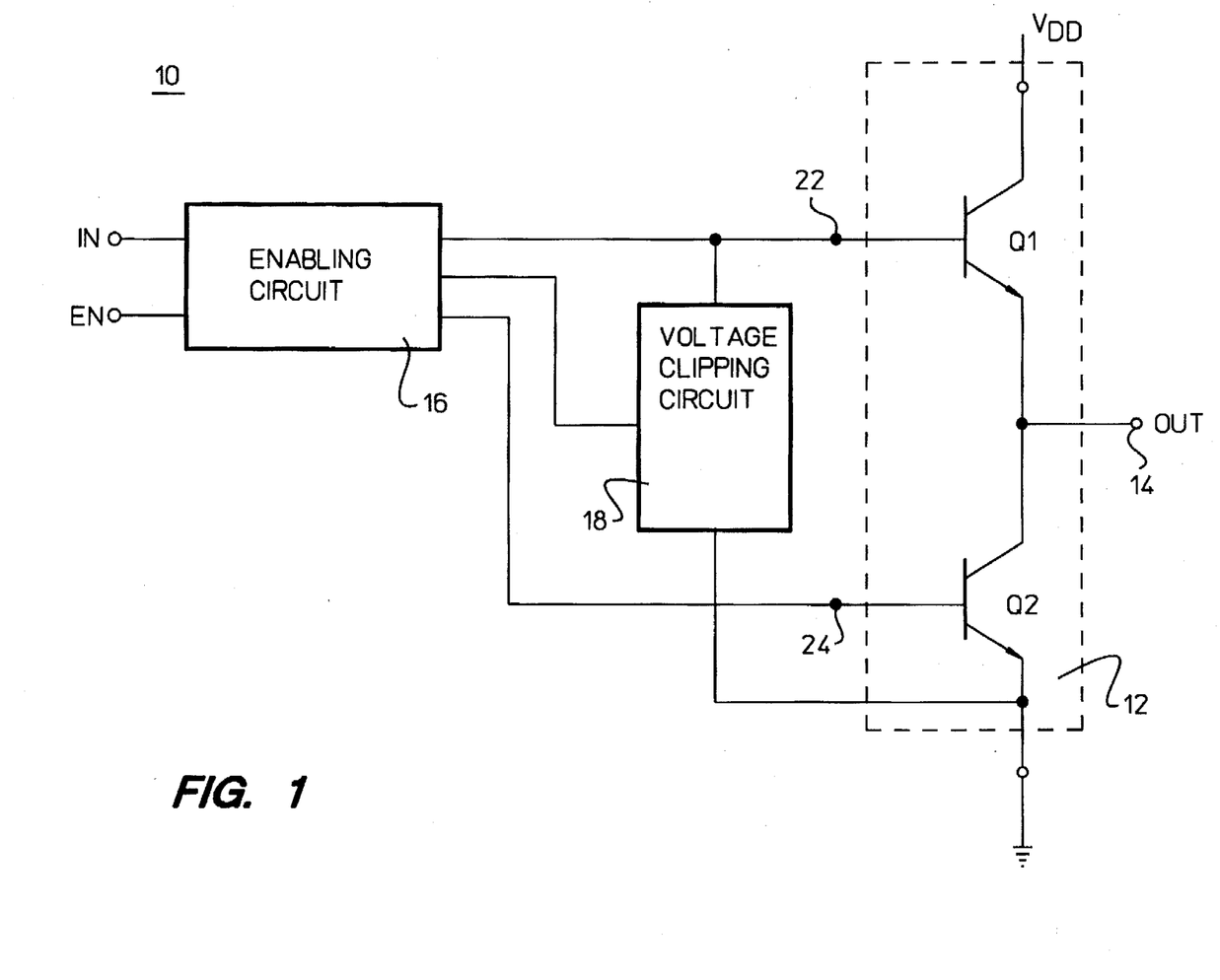
FIG. 1 illustrates a functional block diagram of an inverting tri-state buffer of the present invention.

FIG. 1 illustrates a functional block diagram of an inverting tri-state buffer 10 of the present invention. The inverting tri-state buffer 10 has an output stage 12 that contains an non-inverting amplifier Q1 and a common-emitter amplifier Q2 in a totem-pole configuration. Q1 and Q2 are bipolar transistors. The collector of the non-inverting amplifier Q1 is connected to a power supply VDD. The emitter of the non-inverting amplifier Q1 and the collector of the common-emitter amplifier Q2 are connected at an output node 14. The emitter of the common-emitter amplifier Q2 is connected to ground.

An enabling circuit 16 is connected to the base 22 of the non-inverting amplifier Q1 and the base 24 of the common-emitter amplifier Q2. The enabling circuit 16 receives an enabling signal EN and controls an input signal IN according to the enabling signal EN. A voltage clipping circuit 18 is connected to the enabling circuit 16 to limit the reverse-bias voltage between the base of the non-inverting amplifier Q1 and the emitter of the common-emitter amplifier Q2 when the inverting tri-state buffer 10 is disabled.

The voltage clipping circuit 18 is connected to the enabling circuit 16 and the emitter-follower output stage 12 to maintain a known reverse-bias voltage of approximately a diode drop across the base-emitter path of the non-inverting amplifier Q1 when the inverting tri-state buffer 10 is disabled. This clips the reverse-bias voltage of the non-inverting amplifier Q1 to just below the turn-on voltage for bipolar transistors. Reducing the reverse-bias voltage extends the lifetime of the integrated circuit by slowing the degradation of the device.

Figure 2:
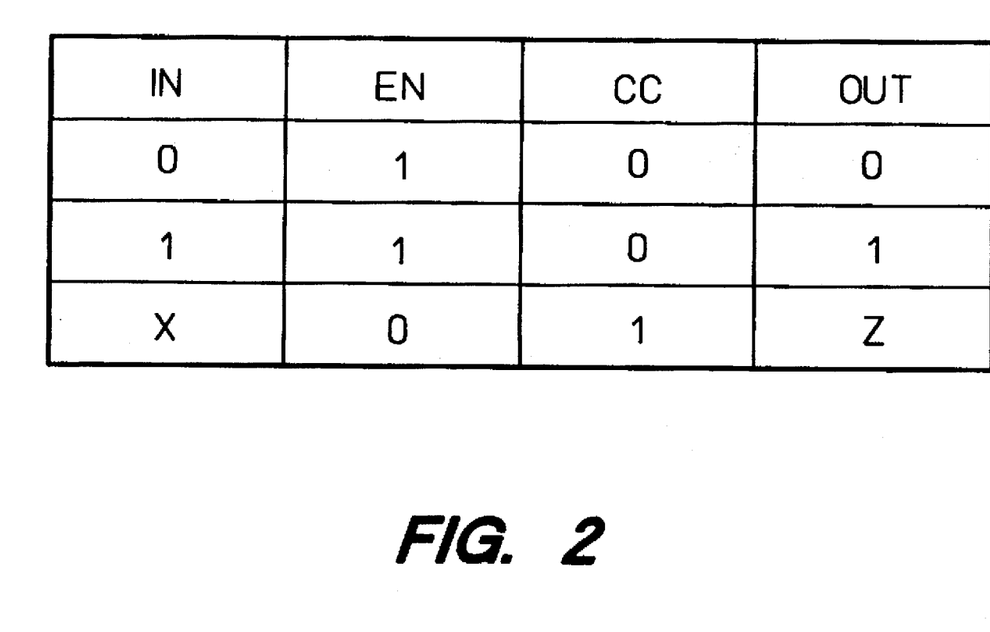
FIG. 2 is a logic diagram of the enabling circuit shown in FIG. 1.

FIG. 2 is a logic table of the enabling circuit 16 shown in FIG. 1. When the enabling signal EN is "on", the output node 14 has a value that corresponds to the value of the input signal IN. When the enabling signal EN is "off", the output node 14 has a high impedance state. CC indicates the output value of the voltage clipping limiting circuit according to the enabling signal EN. An example of the enabling circuit 16 may be implemented in logic gates or more sophisticated circuitry that provides timing control such as the one taught by Joly in U.S. Pat. No. 5,153,464.

Figure 3:
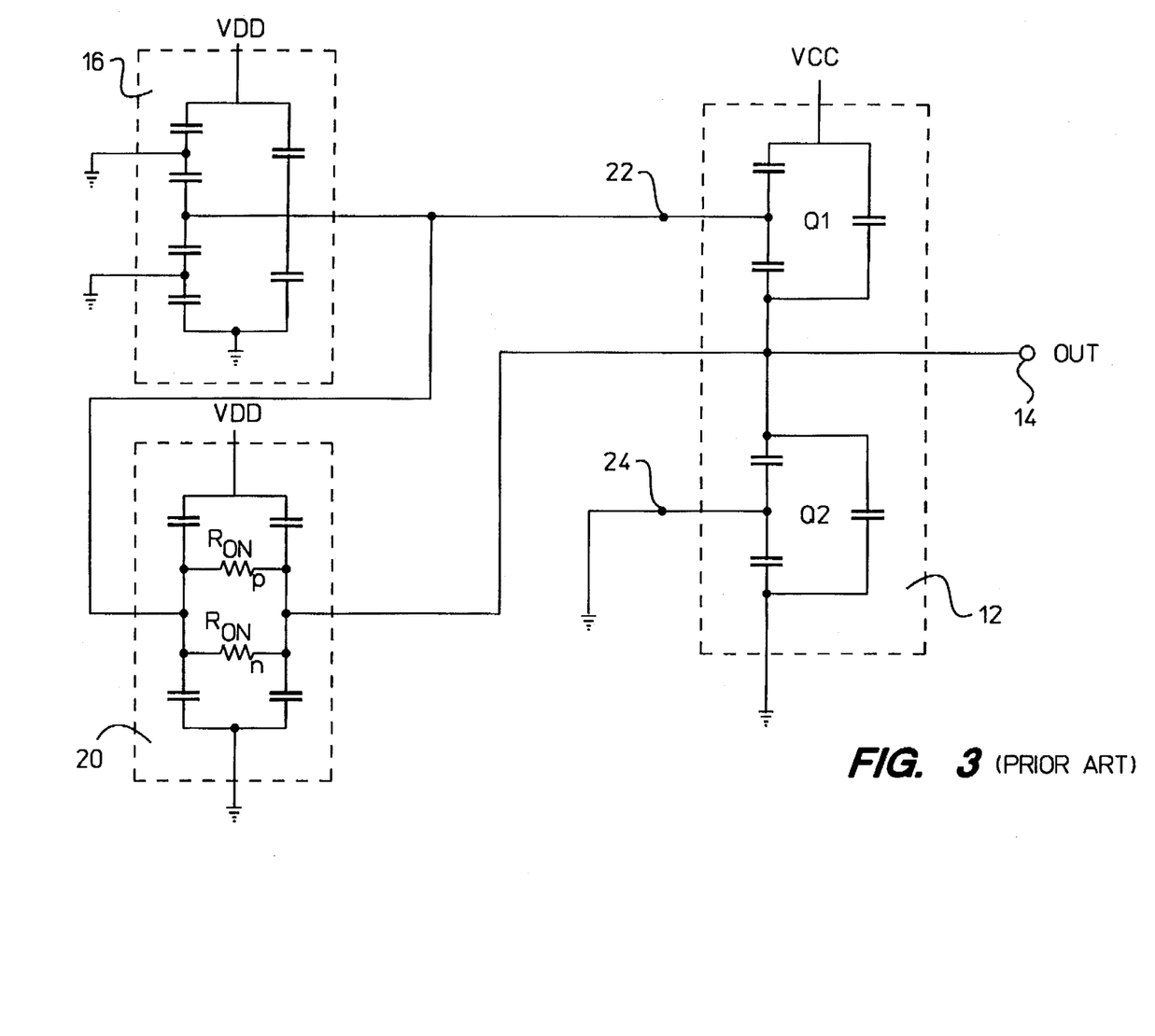
FIG. 3 is a pictorial model of the output capacitance of a prior art inverting tri-state buffer during AC operation.

FIG. 3 is a pictorial model of the output load capacitance within an inverting tri-state buffer of the prior art during AC operation, when only the effect of the AC voltage sources is evaluated. A transmission gate 20 is positioned between the base and the emitter of the non-inverting amplifier Q1 to control the reverse-bias voltage across the non-inverting amplifier Q1. The output load capacitance is due to the transmission gate 20, non-inverting amplifier Q1, the common-emitter amplifier Q2 and the enabling circuit 16.

Figure 4:
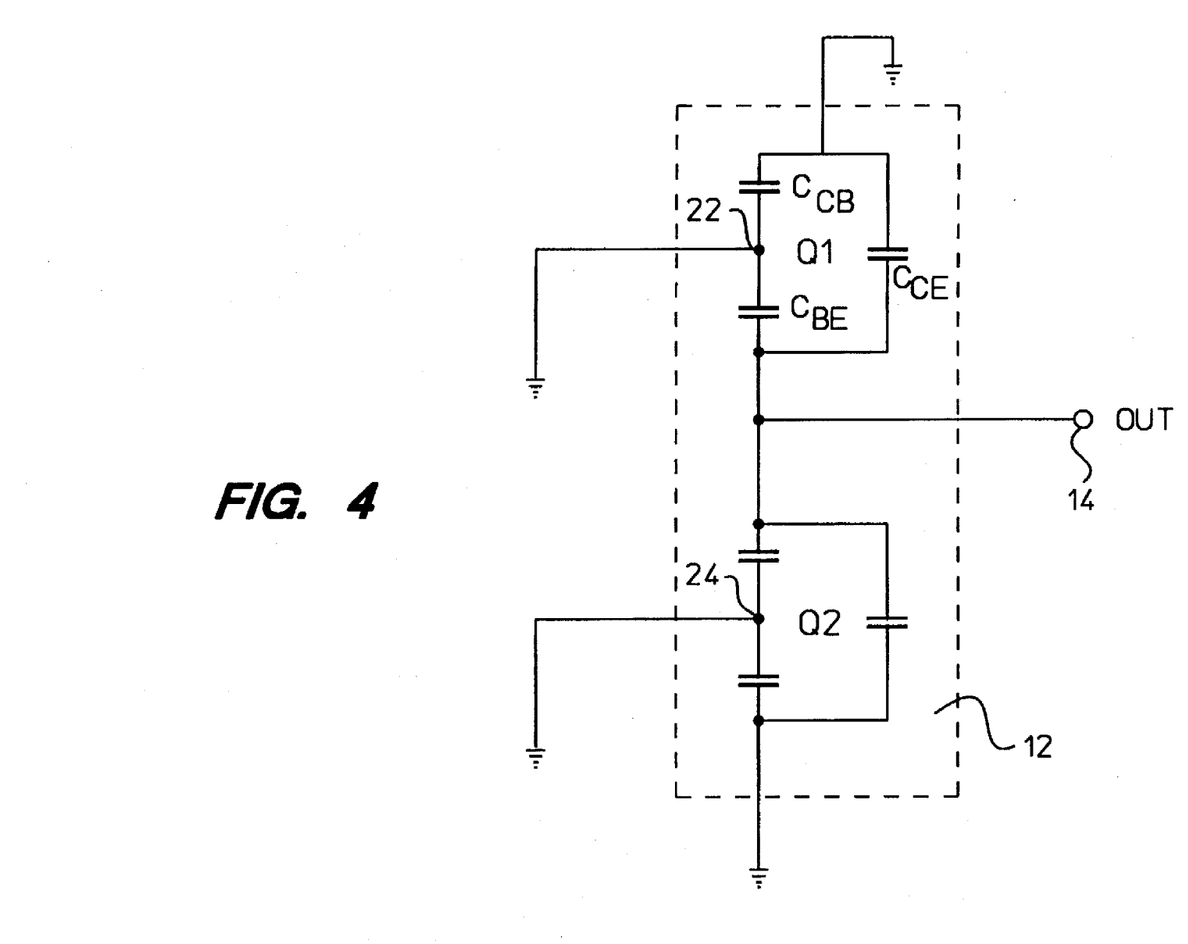
FIG. 4 is a pictorial model of the output capacitance for an inverting tri-state buffer using a clipping limiting circuit.

FIG. 4 is a pictorial model of the output load capacitance of the present invention. The clipping limiting circuit 18 is positioned between the base 22 of the non-inverting amplifier Q1 and ground. The clipping limiting circuit 18 applies two DC voltage sources to the emitter-follower output stage.

The first DC voltage source is positioned between the base 22 of the non-inverting amplifier Q1 and ground. The second DC voltage source is applied to the base 24 of the common-emitter amplifier Q2. During AC operation, all DC voltages appear grounded. The bases 22, 24 of the output stage 12 are therefore set to ground. In the non-inverting amplifier Q1, the base-emitter and collector-emitter junctions contribute to the output load capacitance while in the common-emitter amplifier Q2, the load is due to the collector-base and collector-emitter junctions. This is a dramatic reduction in output load capacitance, as compared to the prior art where the output load capacitance is due to the enabling circuit, emitter-follower output stage, and transmission gate. The reduced load capacitance improves the gain (and thereby requires less power) and performance of the inverting tri-state buffer.

In this embodiment, the voltage clipping circuit 18 is implemented as a two stage current sensitive voltage device that sets and maintains the DC voltage levels on the respective bases 22, 24 of the non-inverting amplifier Q1 and the common-emitter amplifier Q2 within 0.8 volts DC. These bases 22, 24 have DC voltage levels when the inverting tri-state buffer 10 is disabled and thus are considered grounded for AC operation. Even when these transistors are equivalent in dimensions to those used in the prior art, the output capacitance is significantly less.

Figure 5A:
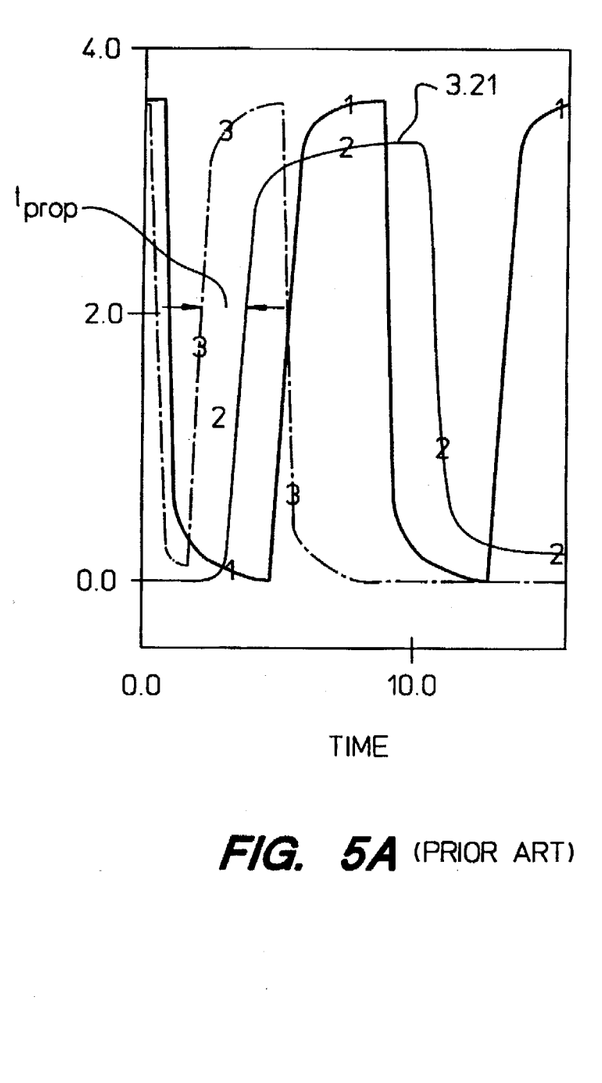
FIGS. 5A and 5B are SPICE simulations illustrating the propagation delays for tri-state buffers when used to drive a bus.
Figure 5B:
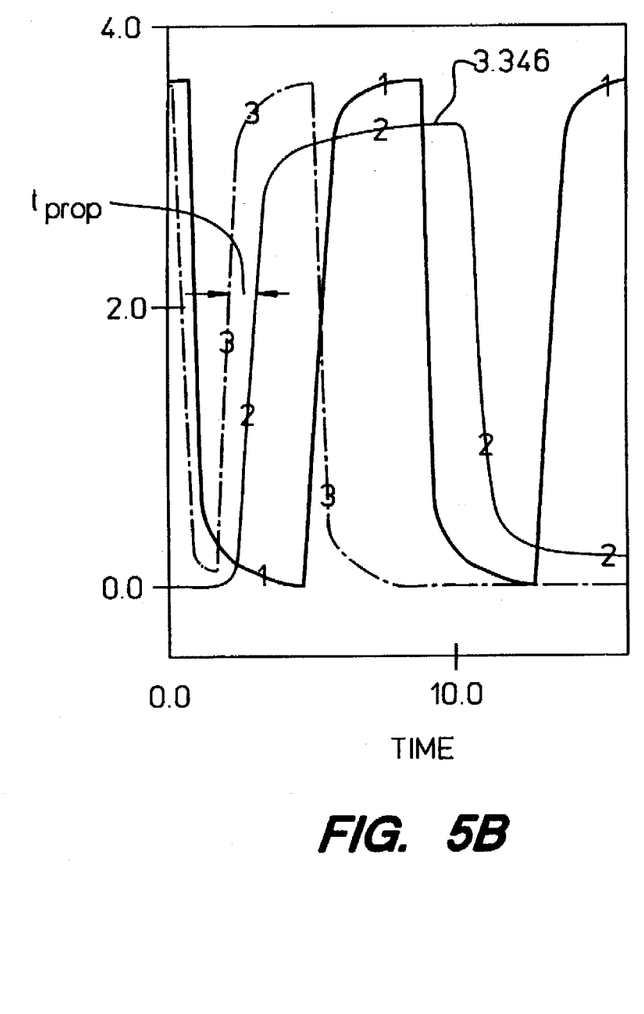

FIGS. 5A and 5B are SPICE simulations illustrating the propagation delays for inverting tri-state buffers when used to drive a bus. Both inverting tri-state buffers were simulated using identical processing parameters and dimensions for the devices. Curve 1, in bold, is the bus input signal and the one labelled 2 is the bus output signal. The enable signal is noted by the dashed line labelled 3. FIG. 5A is a SPICE simulation of a prior art inverting tri-state buffer that contains a transmission gate. The difference between the rise times of the enable and output signals, the propagation delay $t_{prop}$, is ~820 picoseconds. The FIG. 5B is a SPICE simulation of the present inverting tri-state buffer that uses a voltage clamping circuit. $t_{prop}$ is a delay of ~500 picoseconds which is greater than 35% improvement over the prior art inverting tri-state buffer design. This performance improvement increases the number of inverting tri-state buffers that may be used for a given bus while still maintaining superior performance.

Figure 6:
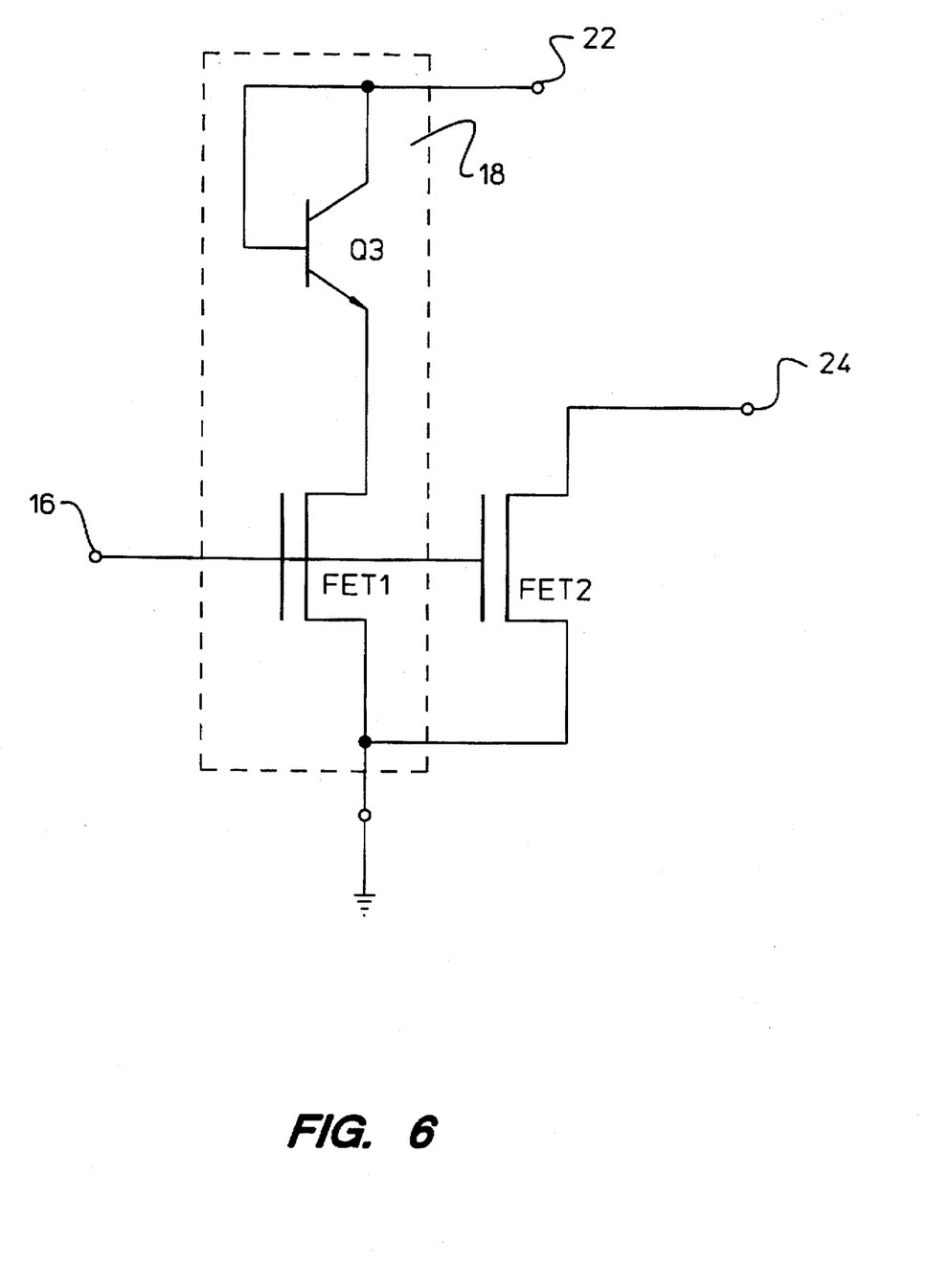
FIG. 6 illustrates the clipping limiting circuit shown in FIG. 2 as a bipolar transistor and a field effect transistor.

FIG. 6 illustrates the clipping limiting circuit 18 shown in FIG. 2 as a bipolar transistor Q3 and field effect transistor FET1. To mimic the behavior of a diode, the collector and base of the bipolar transistor Q3 are tied together. The drain of the field effect transistor FET1 is connected to the emitter of Q3 while the source is connected to ground. The gate receives the enabling signal EN from the enabling circuit 16.

The clipping limiting circuit 18 is positioned between the base of the non-inverting amplifier Q1 and ground to act as a current-controlled voltage device. The bipolar transistor Q3 limits the reverse-bias voltage applied across Q1 to a voltage level just below activation and applies the first DC voltage level to the base of the non-inverting amplifier Q1. A field-effect transistor FET2 applies the second DC voltage level to the base of the common-emitter amplifier Q2. As the bipolar transistors Q1 and Q3 have identical emitter widths, the two transistors track one another. The bipolar transistor Q3 has a smaller emitter length than that of the non-inverting amplifier Q1 so that it will be activated before the non-inverting amplifier Q1 can activate.

It will be apparent to those versed in the art that other circuitry, such as a diode or a current source, can be used in place of the bipolar transistor Q3 to clamp the reverse-bias voltage of the base-emitter junction of Q1.

Figure 7:
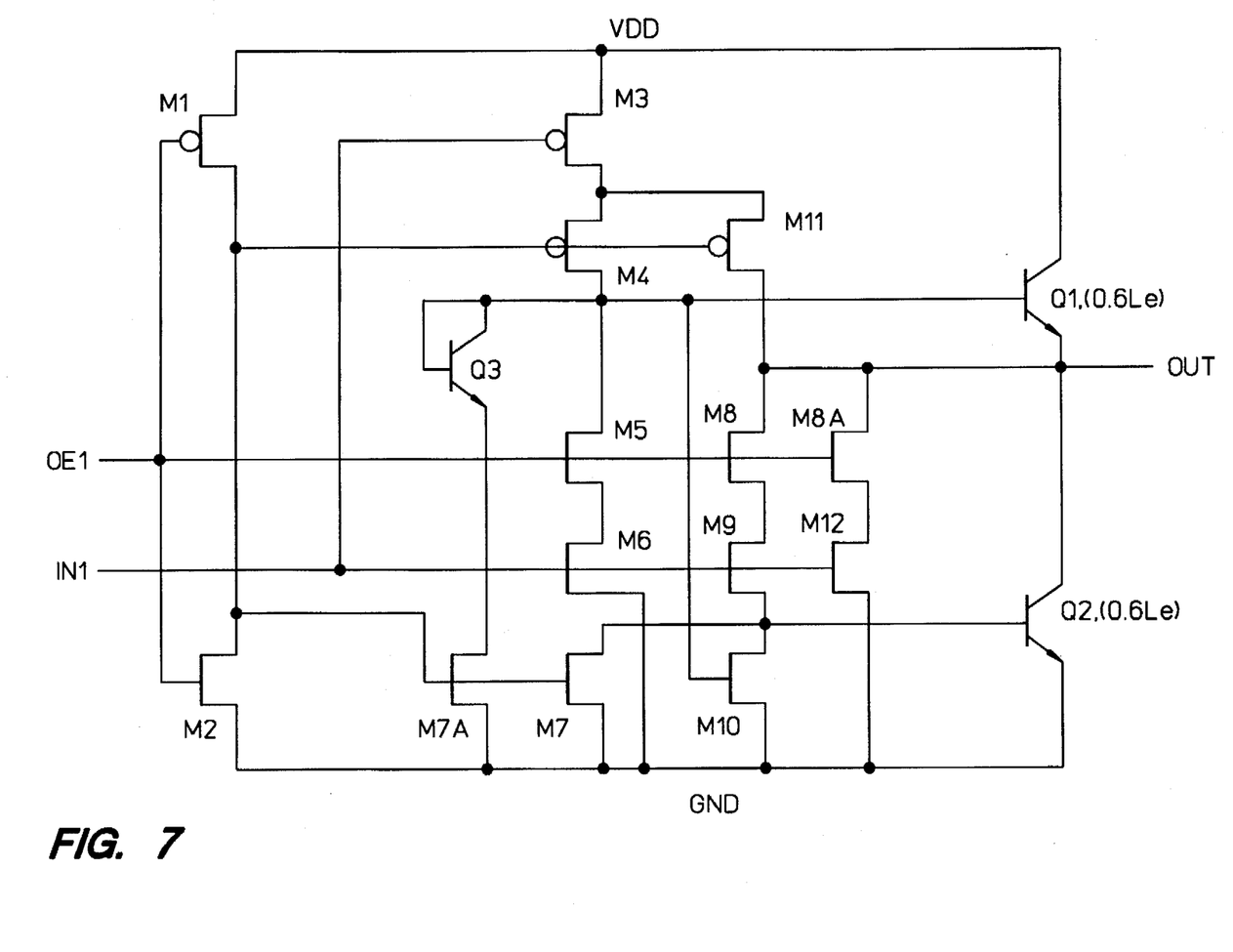
FIG. 7 is a detailed schematic diagram of the inverting tri-state buffer using a bipolar transistor as the clipping limiting circuit.

FIG. 7 is a detailed schematic diagram of the inverting tri-state buffer 10 using bipolar transistor Q3 and field-effect transistor FET1 as the voltage clamping circuit 18. The design was implemented in Hewlett-Packard's BiCMOS14 process.

From the foregoing, it will be appreciated that the present invention can be used for an inverting or a non-inverting tri-state buffer that supports maximum supply voltages during the high-impedance state by clipping the reverse-bias voltage across the base-emitter path in the non-inverting amplifier of the emitter-follower output stage. Limiting the voltage reduces the output leakage current when the path is forward-biased and thereby extends the operating life of an IC. Furthermore, the tri-state buffer has a low output load capacitance that improves the propagation delay particularly when multiple buffers are used together.

It will be apparent that different working embodiments in a wide range can be formed without deviating from the spirit and scope of the present invention. Therefore, the present invention is not restricted by the specific embodiment described and illustrated herein except as being limited in the appended claims.

I claim:

1. A tri-stafe buffer comprising:

an emitter-follower output stage, having an intrinsic load capacitance, that includes, a non-inverting amplifier having a collector connected to a first power terminal, an emitter connected to an output node, and a base;

a common-emitter amplifier having a collector connected to the output node, an emitter connected to a second power terminal, and a base;

an enabling circuit receiving an enabling signal, connected to the bases of the emitter-follower output stage, that controls an input signal according to the enabling signal such that the output node has a high impedance state when the enabling signal has an OFF value and the output node has a value corresponding to the input signal when the enabling signal has an ON value; and a clipping limiting circuit, connected to the enabling circuit, the base of the non-inverting amplifier, and the second power terminal, operative when the tri-state buffer is in a high-impedance mode to limit a reverse-bias voltage between a base of the non-inverting amplifier and the emitter of the common-emitter amplifier.

2. A tri-state buffer as defined in claim 1, the clipping limiting circuit comprising a current sensitive voltage device connected between the base of the non-inverting amplifier and the second power terminal.

3. A tri-state buffer, as defined in claim 2, the current sensitive voltage device comprising a clipping bipolar transistor having a base and a collector connected to the base of the non-inverting amplifier and an emitter connected to the second power terminal.

4. A tri-state buffer, as defined in claim 3, wherein the emitter of the non-inverting amplifier and the emitter of the clipping bipolar transistor have equal lengths.

5. A tri-state buffer as defined in claim 2, the current sensitive voltage device comprising a diode.

6. A tri-state buffer, as defined in claim 1, the clipping limiting circuit further connected to the base of the common emitter to provide a first DC voltage level to the base of the non-inverting amplifier and a second DC voltage level to the base of the common emitter when the enabling signal has the "disable" value.

7. A tri-state buffer as defined in claim 6, the clipping limiting circuit comprising a first and a second DC voltage level setting devices.

8. A tri-state buffer, as defined in claim 7, wherein:

the first DC voltage level setting device comprises a diode having an input terminal connected to the base of the non-inverting amplifier and a diode output; and the second DC voltage level setting device applies a DC voltage level to the base of the common-emitter amplifier when the enabling signal has the "disable" value, wherein the second DC voltage level setting device comprises a field effect transistor having a drain connected to the diode output, a gate receiving the enabling signal, and a source connected to the second power terminal.

9. A tri-state buffer as defined in claim 8, wherein the diode comprises a bipolar transistor having a base and collector connected together and an emitter.

\* \* \* \* \*